United States Patent

Saihara

[11] Patent Number: 5,909,623
[45] Date of Patent: Jun. 1, 1999

[54] MANUFACTURING METHOD OF SEMICONDUCTOR DEVICE

[75] Inventor: Hidenori Saihara, Kitakyushu, Japan

[73] Assignee: Kabushiki Kaisha Toshiba, Kawasaki, Japan

[21] Appl. No.: 09/063,382

[22] Filed: Apr. 21, 1998

[30] Foreign Application Priority Data

Apr. 23, 1997 [JP] Japan ................................. 9-105945

[51] Int. Cl.$^6$ ................................................ H01L 21/331
[52] U.S. Cl. .......................... 438/341; 438/320; 438/348; 438/363; 438/365; 438/481; 438/655; 438/657; 257/518; 257/588
[58] Field of Search .................................. 438/309, 341, 438/481, 348, 363, 365, 655, 657, 320, FOR 249, FOR 165; 148/DIG. 10, DIG. 11, DIG. 26, DIG. 50; 257/518, 588

[56] References Cited

U.S. PATENT DOCUMENTS

| | | | |
|---|---|---|---|
| 4,190,949 | 3/1980 | Ikeda et al. | 438/341 |
| 4,591,398 | 5/1986 | Ouchi et al. | 148/DIG. 50 |
| 4,710,241 | 12/1987 | Komatsu | 438/348 |
| 4,752,591 | 6/1988 | Beitman | 438/365 |
| 4,803,173 | 2/1989 | Sill et al. | 438/365 |
| 4,824,799 | 4/1989 | Komatsu | 438/348 |
| 4,829,016 | 5/1989 | Neudeck | 438/341 |
| 4,965,217 | 10/1990 | Desilets et al. | 148/DIG. 50 |
| 5,073,810 | 12/1991 | Owada et al. | 357/34 |
| 5,118,634 | 6/1992 | Neudeck et al. | 438/341 |
| 5,371,022 | 12/1994 | Hsieh | 438/341 |
| 5,434,092 | 7/1995 | Neudeck | 438/341 |
| 5,780,343 | 7/1998 | Bashir | 438/481 |

FOREIGN PATENT DOCUMENTS

| | | | |
|---|---|---|---|
| 357068049 | 4/1982 | Japan | 438/249 |
| 359028356 | 2/1984 | Japan | 438/249 |
| 360054452 | 3/1985 | Japan | 438/249 |
| 363174366 | 7/1988 | Japan | 438/249 |
| 402203535 | 8/1990 | Japan | 438/249 |

*Primary Examiner*—Peter Toby Brown
*Assistant Examiner*—Long Pham
*Attorney, Agent, or Firm*—Finnegan, Henderson, Farabow, Garrett & Dunner, L.L.P.

[57] ABSTRACT

A manufacturing method of the present invention comprises the first step of forming an epitaxial base layer in an opening of an element-isolating oxide film on a semiconductor substrate in a non-selection condition, the second step of growing a silicon oxide film on the epitaxial base layer and a base polysilicon layer, and the third step of etching the silicon oxide film to expose the polysilicon layer by the etch-back or the CMP. According to this method, the silicon oxide film is left only on the epitaxial base layer, and the planarization of the device can be attained. The present invention also reduces the resistance of the base electrode by providing silicide to the device.

11 Claims, 3 Drawing Sheets

MANUFACTURING METHOD OF SEMICONDUCTOR DEVICE

BACKGROUND OF THE INVENTION

This invention relates to a manufacturing method of a semiconductor device capable of downsizing the device by planarization and increasing the operation speed of the device by the downsizing and by the use of a silicide forming process.

Minimizing an element region on a semiconductor substrate of a semiconductor device is so advantageous for increasing the integration density of a LSI, increasing the operation speed of the device, and reducing the power consumption, and thus has been eagerly studied for years.

The various studies of increasing the integration density of a LSI, increasing the operation speed of the device, and reducing the power consumption, have been proposed in Jpn. KOKAI Pat. Appln. No. 1-187864, Jpn. KOKAI Pat. Appln. No. 3-76228, Jpn. KOKAI Pat. Appln. No. 5-251458, and so on.

FIG. 4 shows the structure of a bipolar transistor as an example of the semiconductor device according to the conventional technique.

This bipolar transistor has an element-isolating oxide film 102 on the surface of a silicon substrate 101, as shown in FIG. 4. The silicon substrate 101 further has an epitaxial base region 103 and a buffer oxide film 105, which are stacked on a predetermined portion thereof. On the element-isolating oxide film 102, the epitaxial base region 103, and the buffer oxide film 105, a base extension polysilicon 104, an oxide film 107, and a nitride film 108 are stacked in order. Further, the sidewall of the opening formed in the central portion of the device is provided with a sidewall nitride film 109, and the opening is provided with a polysilicon emitter electrode 111 and an emitter layer 110 therein.

The manufacturing method of the above-mentioned semiconductor device will be described in detail with reference to FIGS. 5A–5F. At first, the element-isolating oxide film 102 is formed on the silicon substrate 101 (see FIG. 5A). Subsequently, the epitaxial base region 103 thin crystal film having desired property and thickness is formed on the silicon substrate 101 by selective epitaxial growth (see FIG. 5B). Then, the buffer oxide film 105 is deposited by CVD (Chemical Vapor Deposition) on the upper surface of the epitaxial base region 103 (see FIG. 5C). The base extension polysilicon 104 is deposited thereon, and the oxide film 107 and the nitride film 108 are deposited on the base extension polysilicon 104 by CVD, in order. Then, an emitter opening is formed by conventional photolithography. On the sidewall of the opening, the sidewall nitride film 109 is formed. After forming a polysilicon emitter electrode 111 in the emitter opening, a heat treatment is performed to attain solid phase diffusion of impurity from the polysilicon emitter electrode 111 into the epitaxial base region 103 to form an emitter layer 110 in the epitaxial base region 103. In this manner, a complete bipolar transistor is obtained.

In the conventional manufacturing process of the bipolar transistor as mentioned above, however, a silicon epitaxial growth needs to be performed in the epitaxial base region 103, and thus the buffer oxide film 105 needs to be provided to protect the epitaxial base region 103 since a RIE (Reactive Ion Etching) apparatus is used in the forming process of the emitter layer 110. In addition thereto, a photoresist step needs to be performed in forming the buffer oxide film 105. Further, in order to attain a desired alignment precision, and the epitaxial base region 103 thus needs to be formed larger than the region in which the buffer oxide film 105 is formed.

Moreover, the semiconductor device obtained by the actual manufacturing process does not have a planar surface, and thus is not sufficiently downsized, as desired. Further, the base extension polysilicon has not been formed from silicide according to the conventional techniques, and thus the increase in the operation speed by the reduction of the resistance of the electrode, which is attained by forming the base from silicide, cannot have been attained.

BRIEF SUMMARY OF THE INVENTION

The present invention has been developed in consideration of the above-mentioned problems, and intends to provide a manufacturing method of a semiconductor device, capable of downsizing the device and increasing the operation speed of the device.

In order to attain the above-mentioned object, a manufacturing method of a semiconductor device according to the first aspect of the present invention comprises: the first step of forming a layer of silicon across an element-isolating film, whereby an epitaxial layer is formed in an opening of the element-isolating oxide film the element-isolating oxide film and a polysilicon layer is formed on the element-silating oxide film; the second step of growing a silicon oxide film on the epitaxial layer and the polysilicon layer; and the third step of etching the silicon oxide film to expose the polysilicon layer by etch-back so as to leave the silicon oxide film only on the epitaxial layer, wherein the surface of the device is planarized.

A manufacturing method of a semiconductor device according to the second aspect of the present invention comprises: the first step of forming a layer of silicon across an element-isolating film, whereby an epitaxial layer is formed in an opening of element-isolating oxide film the element-isolating oxide film and a polysilicon layer is formed on the element-silating oxide film; the second step of growing a silicon oxide film on the epitaxial layer and the polysilicon layer; and the third step of etching the silicon oxide film to expose the polysilicon layer by the chemical mechanical polishing, so as to leave the silicon oxide film only on the epitaxial layer wherein the surface of the device is planarized.

A manufacturing method of a semiconductor device according to the third aspect of the present invention comprises: the first step of depositing an elementing -isolating oxide film on a portion of a semiconductor substrate; the second step of forming an epitaxial base region having a thickness on a portion of the silicon substrate; and the third step of depositing a silicon oxide film at least on the surface of the epitaxial base region; the fourth step of forming a buffer oxide film only on the epitaxial base region by etching the silicon oxide film to expose a base extension polysilicon formed on the element-isolating oxide film; the fifth step of forming a metal film on the base extension polysilicon and the buffer oxide film; the sixth step of turning a portion of the base extension polysilicon into silicide; the seventh step of depositing an oxide film and a nitride film on the metal film and the silicide; the eighth step of forming a sidewall nitride film on a sidewall of an opening in an emitter section; and the ninth step of forming an emitter layer in the epitaxial base region after forming a polysilicon emitter electrode in the opening of the emitter section.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE DRAWINGS

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

The embodiment of the present invention will be described below with reference to the drawings.

Figure 1:
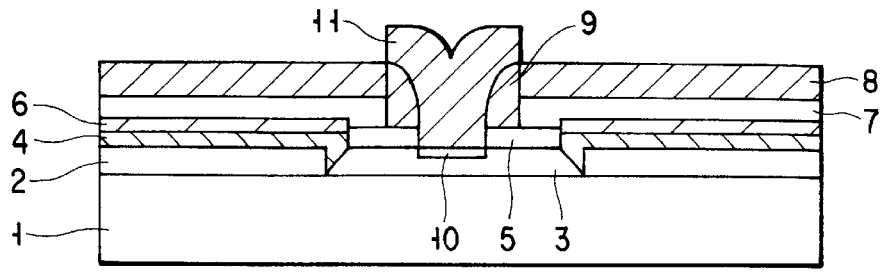
FIG. 1 is a sectional view of a portion of a device manufactured by a manufacturing method of a semiconductor device according to the present invention.

FIG. 1 shows the structure of a device manufactured by a method of manufacturing a semiconductor device according to the present invention. In this embodiment, a bipolar transistor is manufactured in accordance with this method.

As shown in this drawing, the bipolar transistor of the present invention has an element-isolating oxide film 2 on the surface of a silicon substrate 1. An epitaxial base region 3 and a buffer oxide film 5 are deposited at a predetermined position on the surface of the silicon substrate 1. The device is further provided at a predetermined position on the element-isolating oxide film 2 with a base extension polysilicon 4 and a silicide 6 formed in order. Further, an oxide film 7 and a nitride film 8 are deposited in order on the buffer oxide film 5 and the silicide 6. On the sidewall of an opening formed in a central portion, a sidewall nitride film 9 is formed, and a polysilicon emitter electrode 11 and an emitter layer 10 are formed in the opening.

The bipolar transistor having the above-mentioned structure has a planarized surface, and contributes to the downsizing of the device.

In a manufacturing method according to the present invention, the silicon oxide film 5' is etched to expose the base extension polysilicon 4 on the element-isolating oxide film 2 such that the buffer oxide film 5 is formed only on the epitaxial base region 3. With this self-alignment technique, the present invention contributes to attaining downsizing of the device.

Further, the present invention increases the operation speed of the device by forming a low-resistance base electrode in a self-alignment manner wherein metal such as titanium, cobalt, or nickel, is deposited in forming the silicide 6 and then a heat treatment is performed to turn the base extension polysilicon 4 into silicide, and non-reaction metal is removed thereafter.

The manufacturing method of the semiconductor device according to the present invention will be described below with reference to FIGS. 2A–2F.

Figure 2A:
FIG. 2A shows a first step of a manufacturing process according to a semiconductor manufacturing method of the present invention.
Figure 2B:
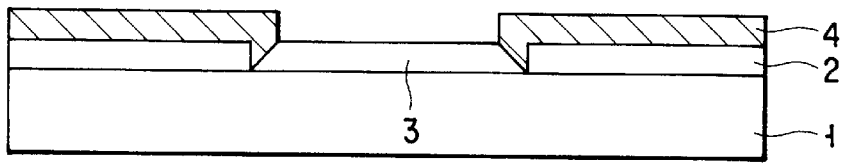
FIG. 2B shows a second step of a manufacturing process according to a semiconductor manufacturing method of the present invention.
Figure 2C:
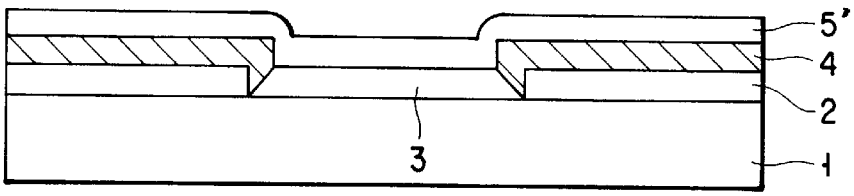
FIG. 2C shows a third step of a manufacturing process according to a semiconductor manufacturing method of the present invention.
Figure 2D:
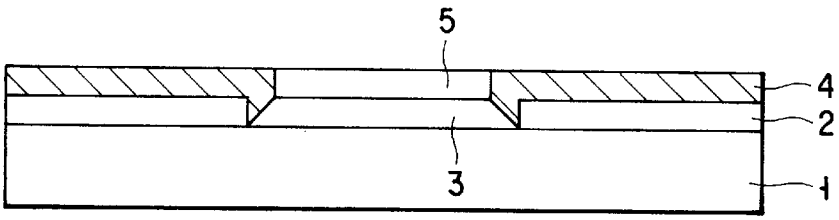
FIG. 2D shows a fourth step of a manufacturing process according to a semiconductor manufacturing method of the present invention.

At first, the element-isolating oxide film 2 is deposited on the surface of the silicon substrate 1 (see FIG. 2A).

Next, the epitaxial base region 3 having a desired property and thickness is formed on the surface of the silicon substrate 1 by the epitaxial growth in a non-selection condition. That is, growth can be performed by the VPE (Vapor Phase Epitaxy) or the like across the entire upper surface, whereby epitaxial growth occurs in an opening of the element-isolating oxide film 2 and a polysilicon layer is formed on the element-isolating oxide film 2 (see FIG. 2B).

Subsequently, the silicon oxide film 5' is deposited by a chemical reaction at a high temperature on both surfaces of the base extension polysilicon 4 and the epitaxial base region 3 in accordance with the CVD (Chemical Vapor Deposition) method. In this time, $SiO_2$ of the silicon oxide film 5' is formed by reacting silane ($SiH_4$) and oxygen by the CVD method (see FIG. 2C).

Next, the silicon oxide film 5' is etched (by, e.g., etch-back or chemical mechanical polishing (CMP)) to expose the base extension polysilicon 4 on the element-isolating oxide film 2 such that the buffer oxide film 5 is formed only on the epitaxial base region 3. No step is formed between the buffer oxide film 5 and the base extension polysilicon 4, and the resulting surface is planarized.

Figure 2E:
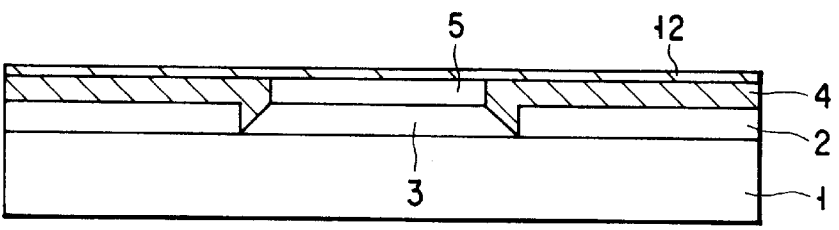
FIG. 2E shows a fifth step of a manufacturing process according to a semiconductor manufacturing method of the present invention.
Figure 2F:
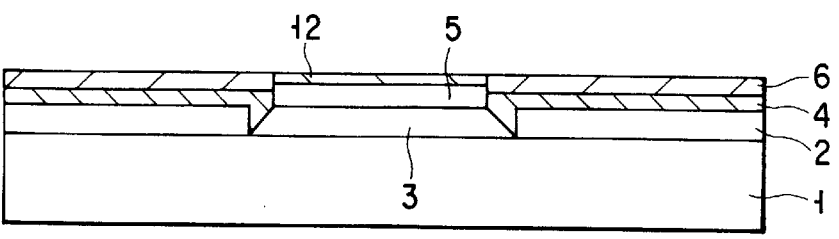
FIG. 2F shows a sixth step of a manufacturing process according to a semiconductor manufacturing method of the present invention.
Figure 5A:
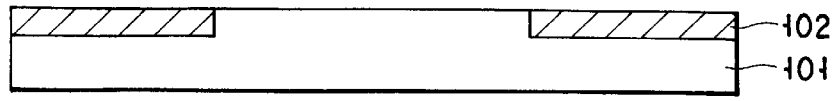
FIG. 5A shows the first step of the manufacturing process according to the conventional semiconductor manufacturing method.
Figure 5B:
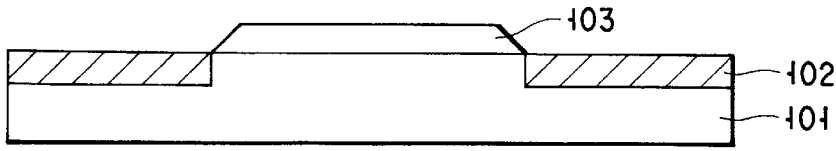
FIG. 5B shows the second step of the manufacturing process according to the conventional semiconductor manufacturing method.
Figure 5C:
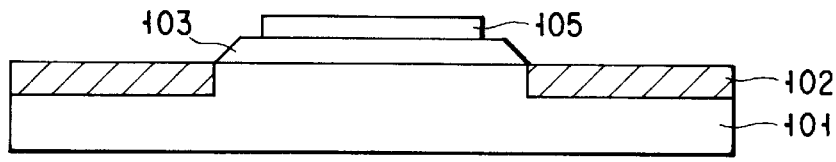
FIG. 5C shows the third step of the manufacturing process according to the conventional semiconductor manufacturing method.
Figure 5D:
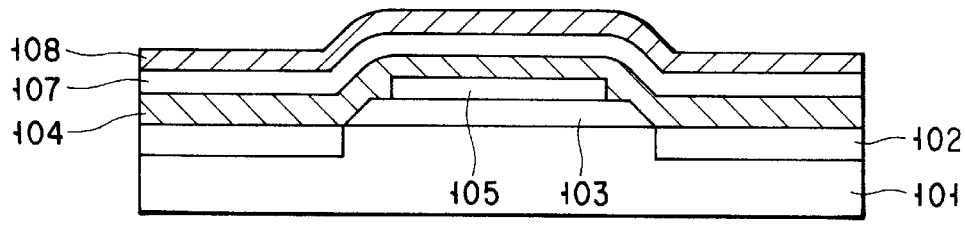
FIG. 5D shows the fourth step of the manufacturing process according to the conventional semiconductor manufacturing method.
Figure 5E:
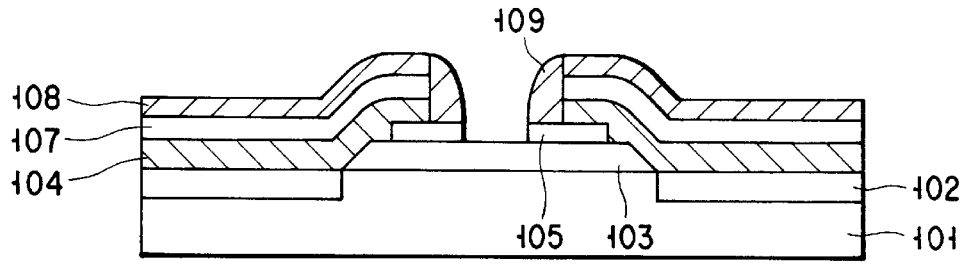
FIG. 5E shows the fifth step of the manufacturing process according to the conventional semiconductor manufacturing method.
Figure 5F:
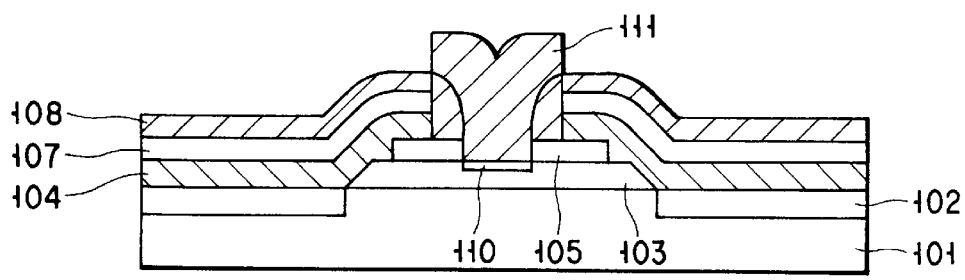
FIG. 5F shows the sixth step of the manufacturing process according to the conventional semiconductor manufacturing method.

Subsequently, metal such as titanium, cobalt, or nickel is deposited on the base extension polysilicon 4 and the buffer oxide film 5 (see FIG. 2E).

Following to the metal deposition, heat treatment (silicidation) is performed to turn the base extension polysilicon 4 into silicide. The currently developed LSI has circuits having high performance and various functions. It is thus preferable that the base electrode has a low resistance. By this silicidation process wherein the base extension polysilicon 4 is turned into silicide, the silicide 6 can be formed on the base extension polysilicon 4. With this low-resistance base electrode, the circuit can operate with high performance (see FIG. 2E).

Figure 3A:
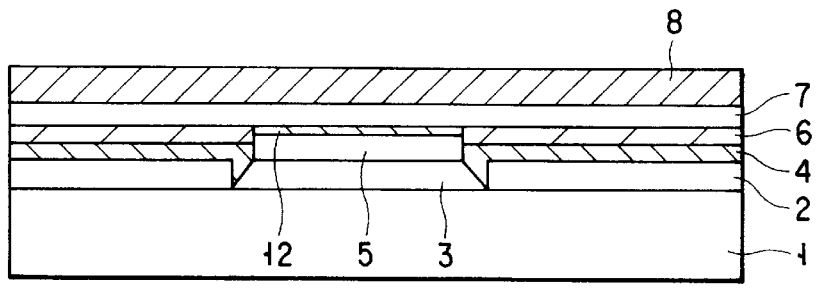
FIG. 3A shows a seventh step of a manufacturing process according to a semiconductor manufacturing method of the present invention.

After the silicidation, the oxide film 7 and the nitride film 8 are deposited by the CVD on the metal film 12 and the silicide 6 formed in the silicidation process, in order. A $Si_3N_4$ film as the nitride film 8 are formed by reacting ammonium ($NH_3$) and dichlorosilane ($SiH_2Cl_2$) or silane ($SiH_4$) (see FIG. 3A).

Figure 3B:
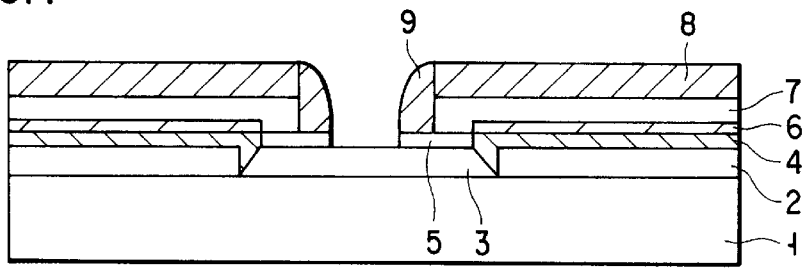
FIG. 3B shows a eighth step of a manufacturing process according to a semiconductor manufacturing method of the present invention.

Subsequently, an emitter section in a central portion of the surface of the device is opened by the conventional photolithography, and the sidewall nitride film 9 is formed on the sidewall of the opening (see FIG. 3B).

Figure 3C:
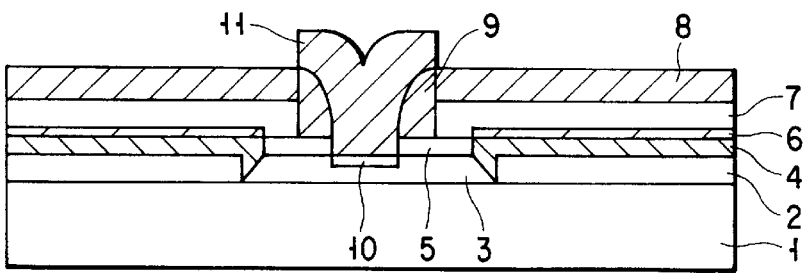
FIG. 3C shows a ninth step of a manufacturing process according to a semiconductor manufacturing method of the present invention.
Figure 4:
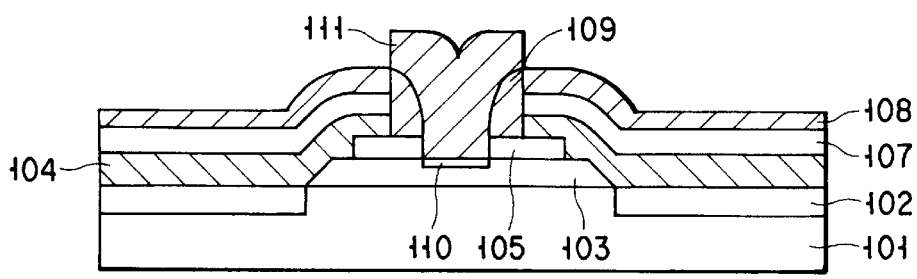
FIG. 4 is a sectional view of a part of a device manufactured by a conventional manufacturing method of the semiconductor device.

The polysilicon emitter electrode 11 is formed in the emitter opening thereafter, and then a heat treatment is performed to attain solid phase diffusion of impurity from the polysilicon emitter electrode 11 into the epitaxial base region, thereby the emitter layer 10 is formed (see FIG. 3C). The complete bipolar transistor of the present invention is obtained in this step.

As described above, according to a manufacturing method of the present invention, the buffer oxide film can be formed smaller than the epitaxial base region in a self-alignment manner without performing the photoresist process, and the downsizing of the device can be attained thereby.

Further, the present invention forms a low-resistance base electrode in a self-alignment manner by turning the base extension polysilicon into silicide in the silicidation process and then removing non-reacted metal. By forming the low-resistance base electrode in this manner, the operation speed of the device can be increased.

Additional advantages and modifications will readily occur to those skilled in the art. Therefore, the invention in its broader aspects is not limited to the specific details, and illustrated examples shown and described herein. Accordingly, various modifications may be made without departing from the sprit or scope of the general inventive concept as defined by the appended claims and their equivalents. More specifically, it goes without saying that the present invention can be applied to the other device, though the bipolar transistor is manufactured in the above-mentioned embodiment.

As described above, the present invention can provide the semiconductor manufacturing method capable of realizing the downsizing of the device and the increase in the operation speed of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of manufacturing a semiconductor device, comprising:

a first step of forming a layer of silicon across an element-isolating oxide film, whereby an epitaxial layer is formed in an opening of the element-isolating oxide film and a polysilicon layer is formed on the element-isolating oxide film;

a second step of growing a silicon oxide film on the epitaxial layer and the polysilicon layer; and a third step of etching the silicon oxide film to expose the polysilicon layer by etch-back so as to leave the silicon oxide film only on the epitaxial layer, wherein a surface of the device is planarized.

2. A method according to claim 1, further comprising a fourth step of forming silicide by depositing metal on the device in a condition where the silicon oxide film is left only on the epitaxial layer and the polysilicon layer is exposed in a portion other than a portion located above the epitaxial layer, and then performing a heat treatment.

3. A method of manufacturing a semiconductor device, comprising:

a first step of forming a layer of silicon across an element-isolating oxide film, whereby an epitaxial layer is formed in an opening of the element-isolating oxide film and a polysilicon layer is formed on the element-isolating oxide film;

a second step of growing a silicon oxide film on the epitaxial layer and the polysilicon layer; and a third step of etching the silicon oxide film to expose the polysilicon layer by chemical mechanical polishing so as to leave the silicon oxide film only on the epitaxial layer, wherein a surface of the device is planarized.

4. A method according to claim 3, further comprising a fourth step of forming silicide by depositing metal on the device in a condition where the silicon oxide film is left only on the epitaxial layer and the polysilicon layer is exposed in a portion other than a portion located above the epitaxial layer, and then performing a heat treatment.

5. A method of manufacturing a semiconductor device, comprising:

a first step of depositing an element-isolating oxide film on a portion of a semiconductor substrate;

a second step of forming an epitaxial base region having a thickness on a portion of the silicon substrate and forming a base extension polysilicon on the element-isolating oxide film;

a third step of depositing a silicon oxide film at least on a surface of the epitaxial base region;

a fourth step of forming a buffer oxide film only on the epitaxial base region by etching the silicon oxide film to expose the base extension polysilicon;

a fifth step of forming a metal film on the base extension polysilicon and the buffer oxide film;

a sixth step of turning a portion of the base extension polysilicon into silicide;

a seventh step of depositing an oxide film and a nitride film on the metal film and the silicide;

an eighth step of forming an opening in an emitter section and a sidewall nitride film on a sidewall of the opening; and a ninth step of forming an emitter layer in the epitaxial base region after forming a polysilicon emitter electrode in the opening of the emitter section.

6. A method according to claim 5, wherein the silicon oxide film is etched to expose the base extension polysilicon such that the buffer oxide film is formed only on the epitaxial base region, whereby the device is formed in a compact, self-aligned manner.

7. A method according to claim 5, wherein the silicide is formed by depositing one of titanium, cobalt, and nickel, the base extension polysilicon is turned into silicide by performing a heat treatment, and non-reacted metal is removed, thereby a base electrode having low resistance is formed to increase an operation speed of the device.

8. A method according to claim 5, wherein the epitaxial base region is formed as a thin crystal layer having a thickness in the second step by the epitaxial growth using vapor phase epitaxy and a polysilicon layer is also formed on the element-isolating oxide film by the vapor phase epitaxy.

9. A method according to claim 5, wherein the silicon oxide film is deposited in the third step by a chemical reaction at a high temperature in accordance with chemical vapor deposition.

10. A method according to claim 5, wherein the silicon oxide film is etched in the fourth step by etch-back as a polishing technique to expose the base extension polysilicon on the element-isolating oxide film such that the buffer oxide film is formed only on the epitaxial base region and a portion between the buffer oxide film and the base extension polysilicon is planarized.

11. A method according to claim 5, wherein the silicon oxide film is etched in the fourth step by chemical mechanical polishing to expose the base extension polysilicon on the element-isolating oxide film such that the buffer oxide film is formed only on the epitaxial base region and a portion between the buffer oxide film and the base extension polysilicon is planarized.

* * * * *

UNITED STATES PATENT AND TRADEMARK OFFICE
CERTIFICATE OF CORRECTION

PATENT NO.   : 5,909,623
DATED        : June 1, 1999
INVENTOR(S)  : Hidenori SAIHARA It is certified that error appears in the above-identified patent and that said Letters Patent is hereby corrected as shown below:

Title page item [54], and column 1, line 1,
   "MANUFACTURING METHOD
   OF" should read --METHOD OF MANUFACTURING A--.

Signed and Sealed this

Seventh Day of December, 1999

Attest:

Q. TODD DICKINSON

*Attesting Officer*   *Acting Commissioner of Patents and Trademarks*